United States Patent
Pan

(10) Patent No.: US 11,823,747 B2
(45) Date of Patent: Nov. 21, 2023

(54) EXTERNAL POWER FUNCTIONALITY TECHNIQUES FOR MEMORY DEVICES

(71) Applicant: Micron Technology, Inc., Boise, ID (US)

(72) Inventor: Lei Pan, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/981,236

(22) PCT Filed: Aug. 27, 2020

(86) PCT No.: PCT/CN2020/111753
§ 371 (c)(1),
(2) Date: Sep. 15, 2020

(87) PCT Pub. No.: WO2022/041052
PCT Pub. Date: Mar. 3, 2022

(65) Prior Publication Data
US 2023/0178157 A1    Jun. 8, 2023

(51) Int. Cl.
*G11C 7/00* (2006.01)
*G11C 16/30* (2006.01)

(52) U.S. Cl.
CPC ................... *G11C 16/30* (2013.01)

(58) Field of Classification Search
CPC ....... G11C 5/147; G11C 5/14; G11C 11/4074; G11C 16/30; G11C 5/143
USPC ................................................. 365/226, 227
See application file for complete search history.

(56) References Cited

U.S. PATENT DOCUMENTS

| 10,725,876 | B2 * | 7/2020 | Kanai | G11C 14/0081 |
| 2010/0110794 | A1 * | 5/2010 | Kim | G11C 16/14 365/51 |
| 2010/0332741 | A1 | 12/2010 | Cornwell et al. | |
| 2017/0351312 | A1 | 12/2017 | Iwase et al. | |
| 2020/0234739 | A1 | 7/2020 | Lee | |

FOREIGN PATENT DOCUMENTS

EP    3503108 A1    6/2019

OTHER PUBLICATIONS

ISA/KR, International Search Report and Written Opinion of the International Searching Authority, Int'l APpl. No. PCT/CN2020/111753, dated May 28, 2021, Korean Intellectual property Office, Seo-gu, Daejeon, Republic of Korea, 8pgs.

* cited by examiner

*Primary Examiner* — Son T Dinh
(74) *Attorney, Agent, or Firm* — Holland & Hart LLP

(57) ABSTRACT

Methods, systems, and devices for external power functionality techniques for memory devices are described. A memory system, which may be coupled to a first power source associated with a first voltage, may detect whether a second power source associated with a second voltage higher than the first voltage is available. The memory device may activate a functionality to use the second power source for the access operations if the second power source is available, and the memory device may then perform one or more access operations using the second voltage from the second power source based on the activated functionality.

20 Claims, 5 Drawing Sheets

EXTERNAL POWER FUNCTIONALITY TECHNIQUES FOR MEMORY DEVICES

CROSS REFERENCE

The present Application for Patent is a 371 national phase filing of International Patent Application No. PCT/CN2020/111753 by PAN et al., entitled "EXTERNAL POWER FUNCTIONALITY TECHNIQUES FOR MEMORY DEVICES," filed Aug. 27, 2020, assigned to the assignee hereof, and expressly incorporated by reference herein.

BACKGROUND

The following relates generally to one or more memory systems and more specifically to external power functionality techniques for memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
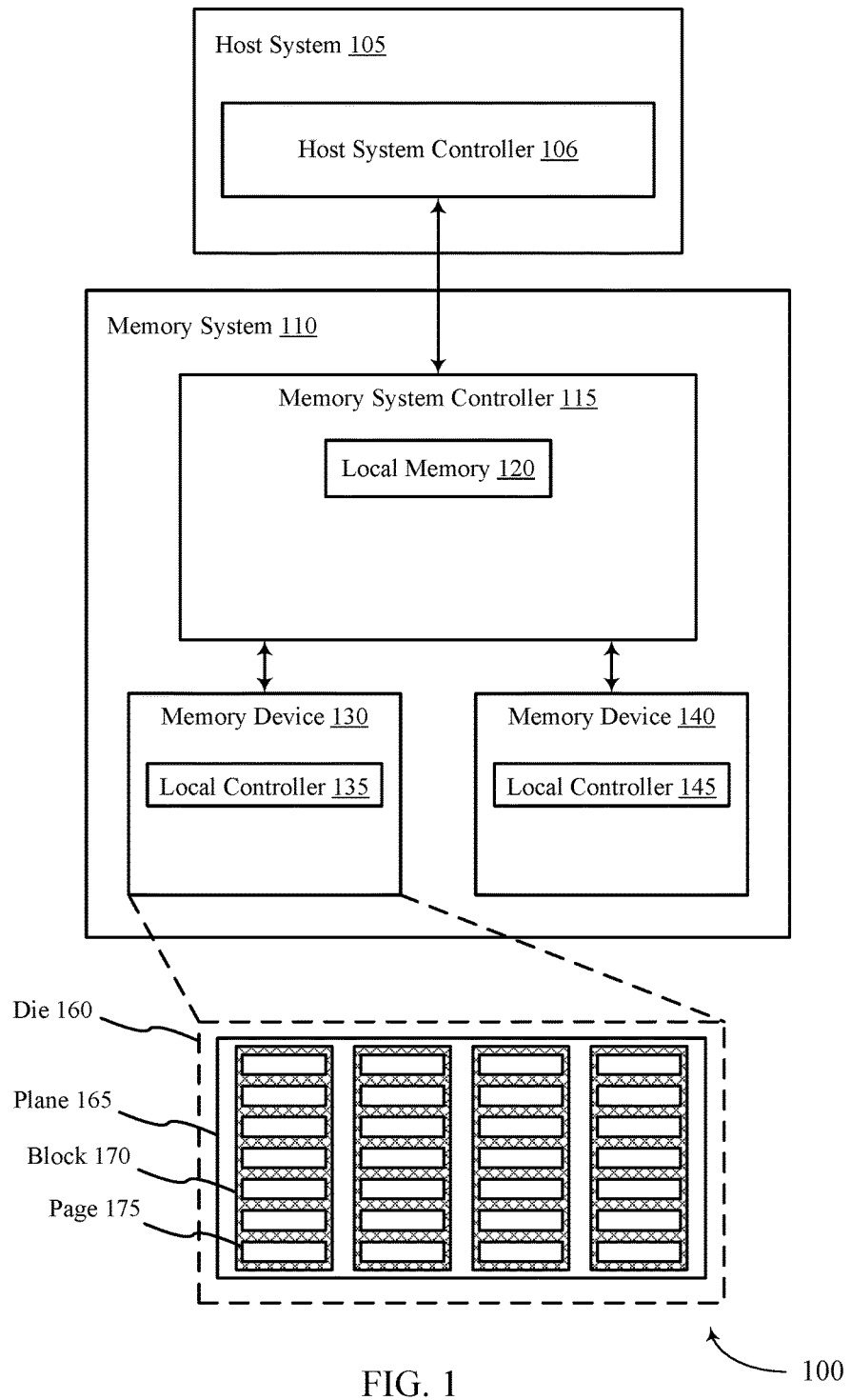
FIG. 1 illustrates an example of a system that supports external power functionality techniques for memory devices in accordance with examples as disclosed herein.

An electronic system may include a memory device and a host device coupled with the memory device. For example, an automotive system may include a memory device to store data for various applications (e.g., automotive applications such as infotainment applications, dashboard applications, among other examples). Power consumption by a memory device may be a concern, both for battery-powered (e.g., mobile) electronic systems and other electronic systems. For example, even if the amount of available energy is not necessarily limited, excess power consumption by a memory device may adversely impact memory device and overall system reliability (e.g., due to self-heating of the memory device from the relatively high power consumption), etc. Thus, reducing the power consumption by a memory device may be desirable in some systems for reliability reasons, among other possible reasons, including in automotive systems that are not necessarily power-constrained.

In accordance with the techniques described herein, a memory device may support a functionality in which an external power source is used to perform access operations, which may result in improved power efficiency and data reliability for a memory system, among other advantages. For example, in the absence of an external power source of an appropriate voltage (e.g., a relatively high voltage, relative to one or more other external power sources used by the memory device), the memory device may activate power conversion circuitry (e.g., charge pumps) in order to convert a first (e.g., lower) voltage from an available external power source into a second (e.g., higher) voltage, and perform access operations using the second voltage (e.g., bias one or more access lines of a memory array using the second voltage or signals based thereupon). If, as described herein, however, an external power source at the second voltage is available, the memory device may deactivate such power conversion circuitry and perform access operations using the second voltage as supplied by the external power source. This may reduce power consumption by the memory device, by the system as a whole (e.g., due to the system supplying the second voltage more efficiently than the internal power conversion circuitry of the memory device otherwise would), or both, and may increase the reliability of the memory device, the system as a whole, or both, among other possible advantages that may be appreciated by one of ordinary skill in the art.

As described herein, while a memory device is coupled with a first external power source, the memory device may be configured to detect whether a second power source external to the memory device is available for use (e.g., an automotive system may include an additional power supply accessible to the memory device). For example, the memory device may detect that the second power source is available and the memory device may activate a functionality for performing access operations using the second power source. The second power source may be associated with a second voltage higher than the first voltage. The memory device may perform one or more access operations using the second power source based on the functionality being activated. Such techniques may enable the memory device to reduce a power consumption at the memory device (e.g., by disabling one or more components otherwise used to perform access operations, such as one or more charge pumps or other components), reduce the likelihood of degrading data reliability due to overheating, or both, among other benefits.

Features of the disclosure are initially described in the context of systems as described with reference to FIG. 1. Features of the disclosure are described in the context systems and circuits as described with reference to FIGS. 2 and 3. These and other features of the disclosure are further illustrated by and described with reference to an apparatus diagram and a flowchart that relate to external power functionality techniques for memory devices as described with reference to FIGS. 4 and 5.

FIG. 1 is an example of a system 100 that supports external power functionality techniques for memory devices in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a vehicle (e.g., airplane, drone, train, automobile, or other conveyance), a computing device such as a desktop computer, a laptop computer, a network server, a mobile device, an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, a serial advanced technology attachment (SATA) controller). The host system 105 may use the memory system 110, for example, to write data to the memory system 110 and read data from the memory system 110. Though one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a peripheral component interconnect express (PCIe) interface, USB interface, Fiber Channel, Small Computer System Interface (SCSI), Serial Attached SCSI (SAS), a double data rate (DDR) memory bus, a dual in-line memory module (DIMM) interface (e.g., DIMM socket interface that supports Double Data Rate (DDR)), Open not-and (NAND) Flash Interface (ONFI), Double Data Rate (DDR), Low Power Double Data Rate (LPDDR). In some cases, the host system 105 may be coupled with the memory system 110 via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Though one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error checking operations or error correcting code (ECC) operations such as error-detecting operations or error-correcting operations, encryption operations, caching operations, media management operations, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAIVI), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). The memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may not be updated without the entire block 170 that includes the page 175 being erased.

In some cases, NAND (or other types) of memory cells may be read, programmed, erased, or otherwise accessed using a relatively high voltage. If a relatively lower voltage power supply is available to a memory device 130, and no power supply at the relatively high voltage is available, the memory device 130 may generate the relatively high voltage (e.g., based on the voltage of the relatively lower voltage power supply, using one or more charge pumps or other power conversion circuitry, which may be in a same die as the memory cells). If, however, a power supply at the relatively high voltage is available, the memory device may access (e.g., read, program, or erase) the memory cells using the relatively high voltage as supplied by the external power supply, and in some case may deactivate or otherwise not use one or more charge pumps or other power conversion circuitry that would otherwise be used to generate the relatively high voltage.

For example, in accordance with the techniques described herein, the memory system 110 may be coupled with a first power source associated with a first voltage. The memory system 110 may be configured to detect whether a second power source external to the memory system 110 is available for use (e.g., an automotive system may include an additional power supply accessible to the memory system 110). For example, the memory system 110 may detect that the second power source is available and the memory system 110 may activate a functionality for performing access operations using the second power source. The second power source may be associated with a second voltage higher than the first voltage. The memory system 110 may perform one or more access operations using the second power source based on the functionality being activated. Such techniques may enable the system 100 to reduce a power consumption (e.g., by deactivating power conversion or other circuitry) and reduce the likelihood of degrading data reliability due to overheating at the memory devices 130 or 140, among other benefits.

The system 100 may include any quantity of non-transitory computer readable media that support external power functionality techniques for memory devices. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform associated functions as described herein.

In some examples, the system 100 may be an example of an automotive system (e.g., a vehicle system). For example, the host system 105 may be an example of a computer system of a vehicle, among other examples. The memory devices 130 or 140 may store data for various applications of the system 100 (e.g., automotive applications such as infotainment applications, dashboard applications, among other examples of applications for a vehicle system).

Figure 2:
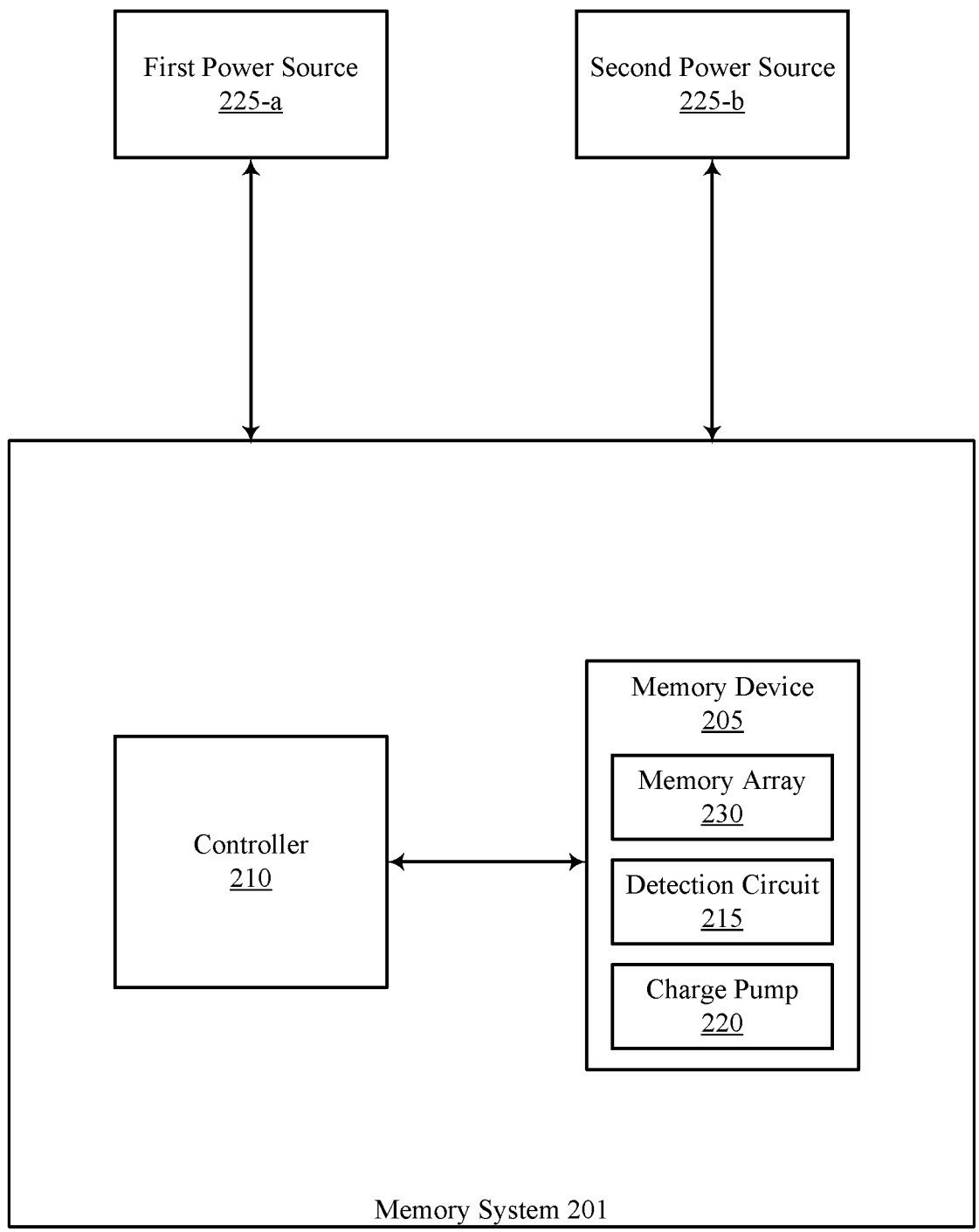
FIG. 2 illustrates an example of a memory system that supports external power functionality techniques for memory devices in accordance with aspects of the present disclosure.

FIG. 2 illustrates an example of a block diagram 200 that supports external power functionality techniques for memory devices in accordance with aspects of the present disclosure. In some examples, the block diagram 200 may implement aspects of the system 100. For example, the block diagram 200 may include a memory system 201, a memory device 205, and a controller 210, which may be examples of the memory system 110, the memory devices 130 or 140, and the various controllers of the system 100, respectively, as described with reference to FIG. 1.

The memory system 201 may include the controller 210 coupled to the memory device 205. Although shown as separate for illustrative clarity, in some cases the controller 210 may be included in the memory device 205, or some components of the memory device (e.g., the detection circuit 215, the charge pump 220, the memory array 230) may be located in the controller 210 or otherwise located within or external to the memory system 201.

In some examples, the memory system 201 (e.g., the memory device 205) may be coupled to a first power source 225-a external to the memory system 201. For example, the memory system 201 may be an example of a NAND or managed NAND device storing data for one or more applications of a host system (e.g., automotive applications such as infotainment applications, dashboard applications, among other examples of applications for a vehicle system). The memory system 201 may be connected to the first power source 225-a associated with a first voltage.

The memory system 201 may use a voltage that is different (e.g., higher) than the first voltage for one or more access operations. In such examples, the memory system 201 may use the charge pump 220 to generate the different voltage, so the different voltage may be used to perform an access operation (e.g., to bias on or more components of the memory array 230 as part of the access operation). As an illustrative example, a capacitor (not shown) may be coupled to the first power source 225-a to charge the capacitor to the first voltage and the circuit including the capacitor may be reconfigured via a switch such that the capacitor is in series with the power supply (e.g., the first power source 225-a) and the load through the capacitor, which may enable the charge pump 220 to realize a higher voltage across the load (e.g., a sum of the first voltage and the voltage stored on the capacitor).

In some cases, the memory system 201 may be coupled with a second power source 225-b, which when available, the memory system 201 may use to perform one or more operations (e.g., access operations). In some examples, the second power source 225-a may be an additional power supply of a vehicle (e.g., a high voltage power supply of an electrical system within a vehicle). When available, the second power source 225-a may or may not be used by one or more other components of the system (e.g., the second power source 225-a may in some cases be connected to a system mainboard of a vehicle, for example). As an illustrative example, a vehicle may include multiple types of power supplies. For instance, an automotive platform may include a 12 volt (V) power supply and a 24V power supply, although any type of power supply may be used. In some cases, the types of power supplies may each have a common power rail (e.g., the 12V and 24V power supply types may each include a 12V power rail in the system). In some examples, the voltage of a power supply type may vary based on an operating mode (e.g., a 24V power supply may be capable of supplying 24V in a first operating mode such as a battery voltage mode and 28V in a second operating mode such as an engine or alternator mode, among other examples of modes, types, and quantities). In some examples, the voltage of the second power source 225-b may be greater than the first voltage of the first power source 225-a. And in some cases, the voltage of the second power source 225-b may be represented or referred to as Vpp, and a functionality that uses the second power source 225-b may be referred as a Vpp functionality.

The memory system 201 may be configured to determine (e.g., autonomously) whether the second power source 225-b is available for use by the memory system 201. For example, the detection circuit 215 may be configured to detect whether the second power source 225-b is available or is unavailable based on whether a voltage at an input (e.g., pin or ball) of the memory system 201 is at Vpp (e.g., satisfies a threshold voltage at or below Vpp).

In some examples, the memory system 201 may determine whether the second power source 225-b is available during an initialization period. For example, the memory system 201 may receive power via the first power source 225-a and begin an initialization procedure at a first time (e.g., the firmware of the memory system 201 may be "brought up," or turned on as part of the initialization procedure, for example, when a vehicle is started, among other examples of initialization procedures). After the firmware of the memory system 201 is brought up, the memory system 201 may detect whether the second power source 225-b (e.g., the voltage Vpp) is available.

In some examples, the memory system 201 may activate a functionality for performing access operations using the second power source 225-b, which may be referred to as a Vpp functionality (e.g., a NAND or managed NAND Vpp functionality). For example, the controller 210 may be an example of a MNAND controller (e.g., if the memory system 201 is an example of a MNAND system). The controller 210 may send a command, to the memory device 205, to activate the functionality, such as a SET FEATURE command (e.g., an EFh command) indicating to activate the functionality.

In some examples, the memory system 201 may activate the functionality based on (e.g., in response to) detecting the second power source 225-b during the initialization period. For example, the memory system 201 (e.g., the detection circuit 215) may determine that the second voltage of the second power source 225-b is stable within the initialization period (e.g., a time period between beginning the initialization procedure at a first time and completing the initialization procedure for the firmware at a second time). Determining that the second power source 225-b is stable may, in some examples, include determining that a detected voltage (e.g., Vpp) satisfies one or more thresholds for a period of time (e.g., the voltage may change relatively little from a threshold value for a configured period of time). In some examples, if the second power source 225-b is stable within the initialization period, the Vpp functionality initialization and enablement (e.g., the activation of the functionality to use the second voltage higher than the first voltage) may be triggered subsequent to the initialization procedure. In some other examples, if the second power source 225-b is not stable within the initialization period, the memory system 201 may refrain from activating the functionality or may deactivate the functionality (e.g., a corresponding pin or ball may be determined to not be functional and the memory system 201 may use the charge pump 220 for access operations associated with a relatively high voltage). As an illustrative example, the memory system 201 may determine that the second power source 225-b is unavailable for use (e.g., and the memory system 201 may refrain from activating the functionality or may deactivate the functionality for using the second power source 225-b for access operations). The memory system 201 may use a different power source 225 (e.g., the first power source 225-a) or a charge pump 220 (e.g., for generating relatively high voltages than the first power source 225-a) for access operations when the functionality is deactivated, as described herein.

The memory system 201 may perform one or more access operations using the activated functionality. For example, the memory system 201 may perform read operations, write operations, erase operations, or idle mode operations using the second power source 225-b based on activating the functionality (e.g., using the Vpp functionality). In some examples, the memory system 201 may deactivate the charge pump 220 based on the activated functionality. By using the second power source 225-b instead of the charge pump 220 for one or more access operations, the memory system 201 may perform the access operations with less power consumption (e.g., improved power efficiency in the system), the memory system 201 may perform relatively quicker access operations (e.g., due to applying the second voltage quicker than generating the second voltage via the charge pump 220), a memory array of the memory device 205 may avoid heat damage from relatively high power consumption which may result in more reliable data storage, or any combination thereof, among other advantages.

Figure 3:
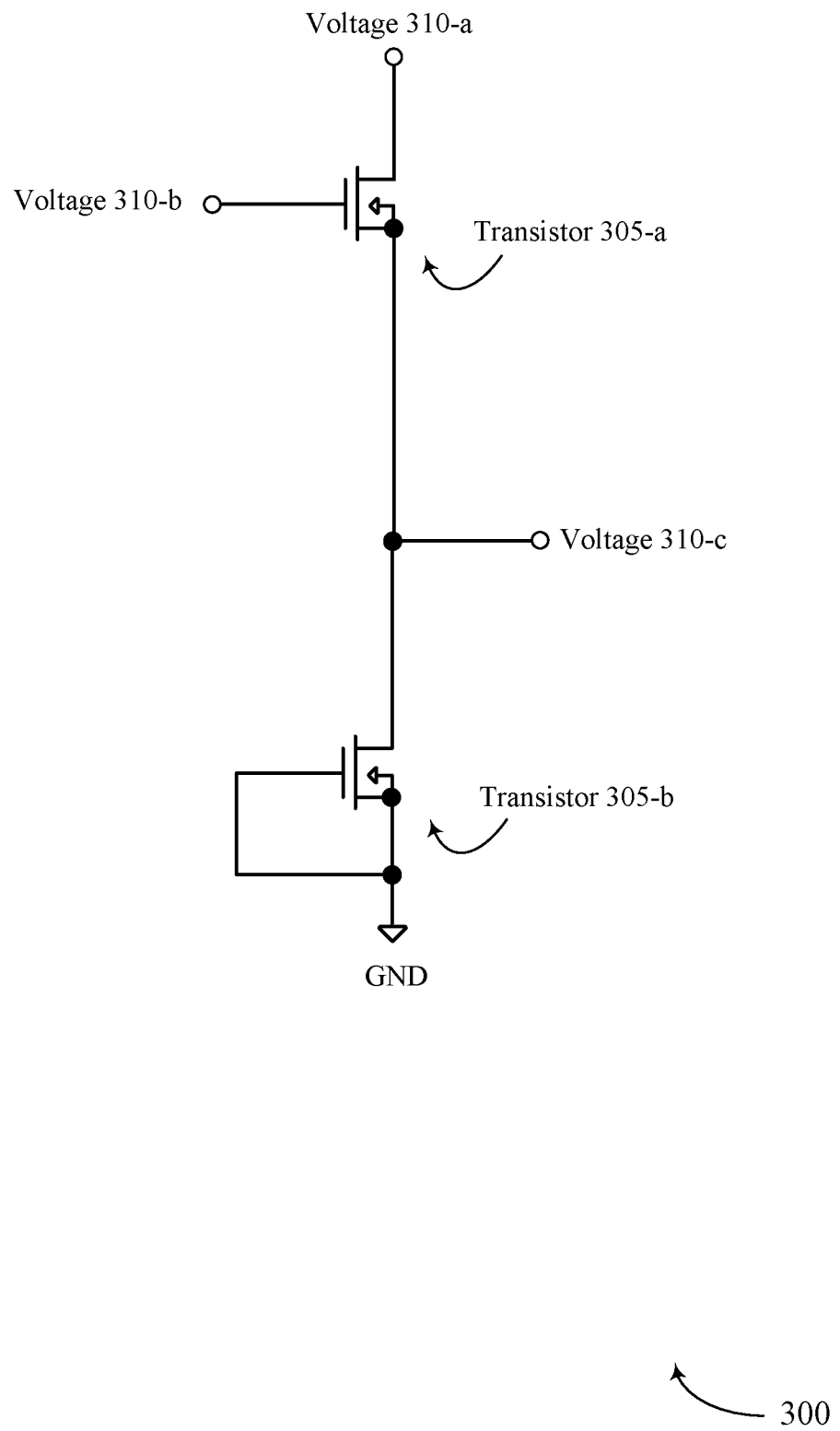
FIG. 3 illustrates an example of a circuit that supports external power functionality techniques for memory devices in accordance with aspects of the present disclosure.

FIG. 3 illustrates an example of a circuit 300 that supports external power functionality techniques for memory devices in accordance with aspects of the present disclosure. In some examples, the circuit 300 may implement aspects of the system 100 and/or the block diagram 200. For example, the circuit 300 may illustrate an example detection circuit 215 for detecting whether a higher voltage power supply is available for use for one or more access operations, although it is to be understood that any method or circuit for detection of the power supply may be implemented without deviating from other teachings herein.

The circuit 300 may include one or more components for detecting whether a power source is available (e.g., a second power source 225-b as described with reference to FIG. 2). For example, the circuit 300 may include a transistor 305-a and a transistor 305-b. In some examples, the transistor 305-a may be referred to as an enhanced mode N-type metal-oxide-semiconductor (NMOS) "Q1" and the transistor 305-b may be referred to as a dependent mode NMOS "Q2." Such a configuration may enable a memory system to detect whether the voltage 310-b (e.g., a voltage Vpp of a power source external to the memory system) is available for use by the memory system.

For example, the voltage 310-b may be coupled to the gate of the transistor 305-a and also coupled at an input (e.g., pin or ball) of the memory system to which the second power source may be coupled. If the voltage 310-b is on (e.g., the second power source Vpp is available for use by the memory system), then the voltage 310-c (e.g., a detecting voltage which may be referred to as Vdetect) may be sufficiently high so as to turn on the transistor 305-a (e.g., may be above a threshold voltage of the transistor 305-a), which may cause voltage 310-c to approach or equal the voltage 310-a. In some examples, the voltage 310-a may be an example of a reference voltage (e.g., Vref) generated based on a first power supply (e.g., a first power source 225-a) associated with a lower voltage than the second power supply.

Thus, for example, the circuit 300 may detect that the voltage 310-b is available (e.g., the second power source Vpp is available for use by the device) if the voltage 310-c is at or near the voltage 310-a (e.g., based on comparing the voltage of the node associated with voltage 310-c to a threshold voltage that is lower than the voltage of the node associated with voltage 310-c when the transistor 305-a is turned on (e.g., activated). Correspondingly, the circuit 300 may detect that the voltage 310-*b* is unavailable (e.g., the second power source Vpp is unavailable for use by the device) based on the value of the voltage 310-*c* failing to satisfy such a threshold (e.g., the voltage 310-*c* is at or relatively closer to a ground voltage, as compared to the voltage 310-*a*, among other examples of thresholds).

Accordingly, a memory system may receive a signal (e.g., the Vdetect such as the voltage 310-*c*) indicating whether the second power source is available, and the memory system may enable or disable a corresponding functionality (e.g., a Vpp functionality) based on the received signal.

In some examples, transistor 305-*b* may be on (e.g., the transistor 305-*b* may be a dependent mode NMOS and the voltage between the gate and source of the transistor 305-*b* may be zero and thus the transistor 305-*b* may have a relatively limited current between the drain and the source of the transistor 305-*b*). In such examples, the transistor 305-*b* may reduce a power consumption of the circuit 300. Additionally or alternatively, the circuit 300 may implement a relatively high value resistor (e.g., rather than the transistor 305-*b*).

Figure 4:
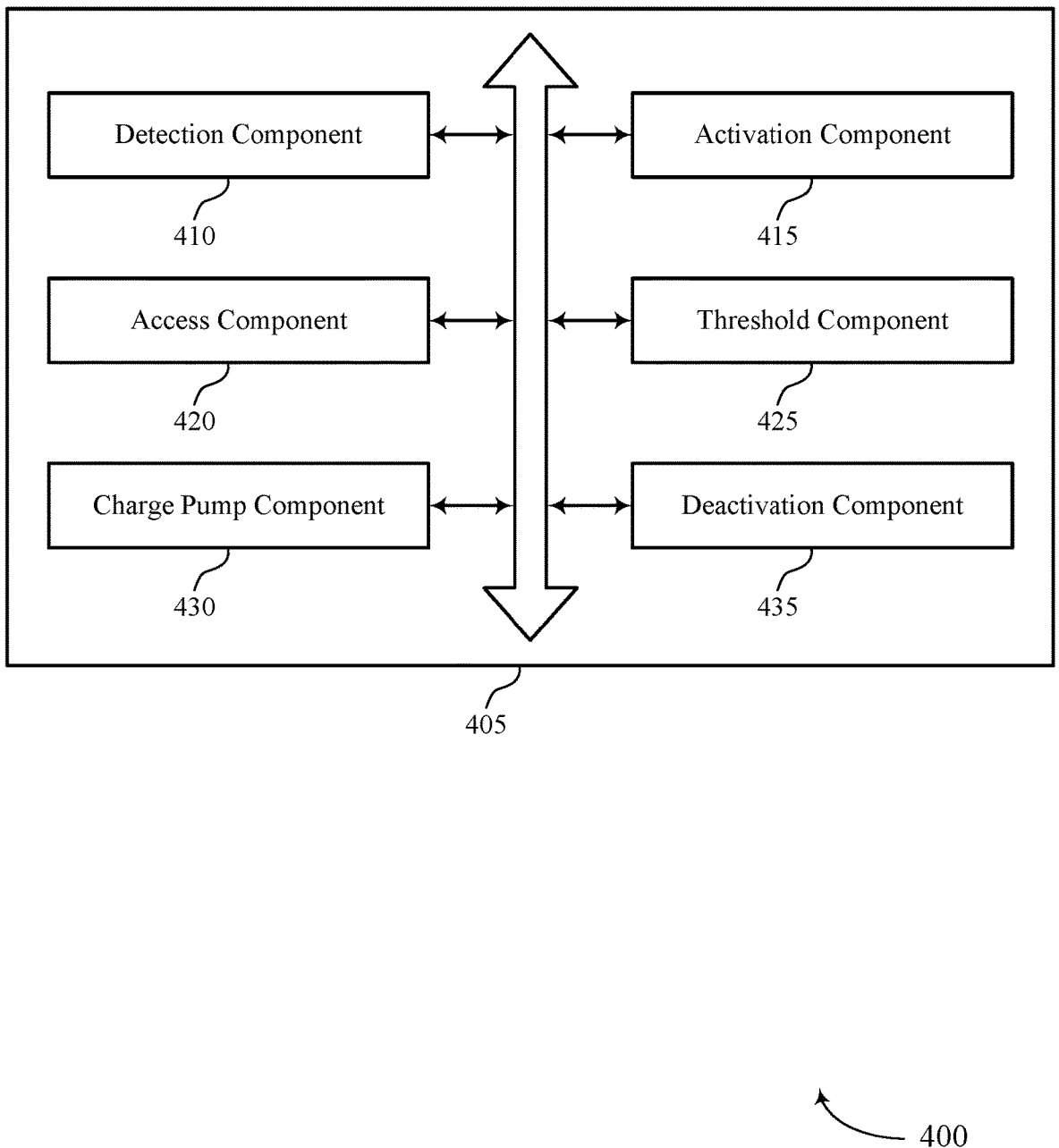
FIG. 4 shows a block diagram of a memory device that supports external power functionality techniques for memory devices in accordance with aspects of the present disclosure.

FIG. 4 shows a block diagram 400 of a memory device 405 that supports external power functionality techniques for memory devices in accordance with aspects of the present disclosure. The memory device 405 may be an example of aspects of a memory device or a memory system as described herein with reference to FIGS. 1-3. The memory device 405 may include a detection component 410, an activation component 415, an access component 420, a threshold component 425, a charge pump component 430, and a deactivation component 435. Each of these modules may communicate, directly or indirectly, with one another (e.g., via one or more buses).

The detection component 410 may detect, when the memory device is coupled with a first power source external to the memory device and associated with a first voltage, that a second power source external to the memory device is available for use by the memory device, the second power source associated with a second voltage greater than the first voltage. In some examples, the detection component 410 may detect that the second power source is coupled with an input of the memory device. In some cases, the detecting occurs during an initialization period for the memory device. In some cases, the second power source includes a power supply within an automotive system.

In some examples, the detection component 410 may monitor a node of a detection circuit, where the node is configured to be coupled with a reference voltage in response to the second power source being coupled with the input of the memory device. In some examples, the threshold component 425 may determine that a voltage of the node satisfies a threshold voltage, where detecting that the second power source is available for use by the memory device is based on the voltage of the node satisfying the threshold voltage, where the reference voltage satisfies the threshold voltage. In some cases, a detection circuit includes one or more transistors configured to couple the node with the reference voltage in response to the second power source being coupled with the input of the memory device.

The activation component 415 may activate a functionality for performing access operations using the second power source based on detecting that the second power source is available. The threshold component 425 may determine that the second power source satisfies a threshold voltage for a threshold duration during the initialization period, where activating the functionality is based on the second power source satisfying the threshold voltage for the threshold duration.

The access component 420 may perform one or more access operations using the second power source based on the functionality being activated. In some examples, the access component 420 may perform a read operation, a write operation, an erase operation, or any combination thereof using the second voltage from the second power source.

The charge pump component 430 may refrain from using a charge pump of the memory device for the one or more access operations based on the functionality for performing access operations using the second power source being activated.

In some examples, the detection component 410 may detect that the second power source external to the memory device is unavailable for use by the memory device. The deactivation component 435 may deactivate the functionality for performing access operations using the second power source being deactivated. In some examples, the charge pump component 430 may perform additional operations using a charge pump of the memory device based on the functionality for performing access operations using the second power source being deactivated.

Figure 5:
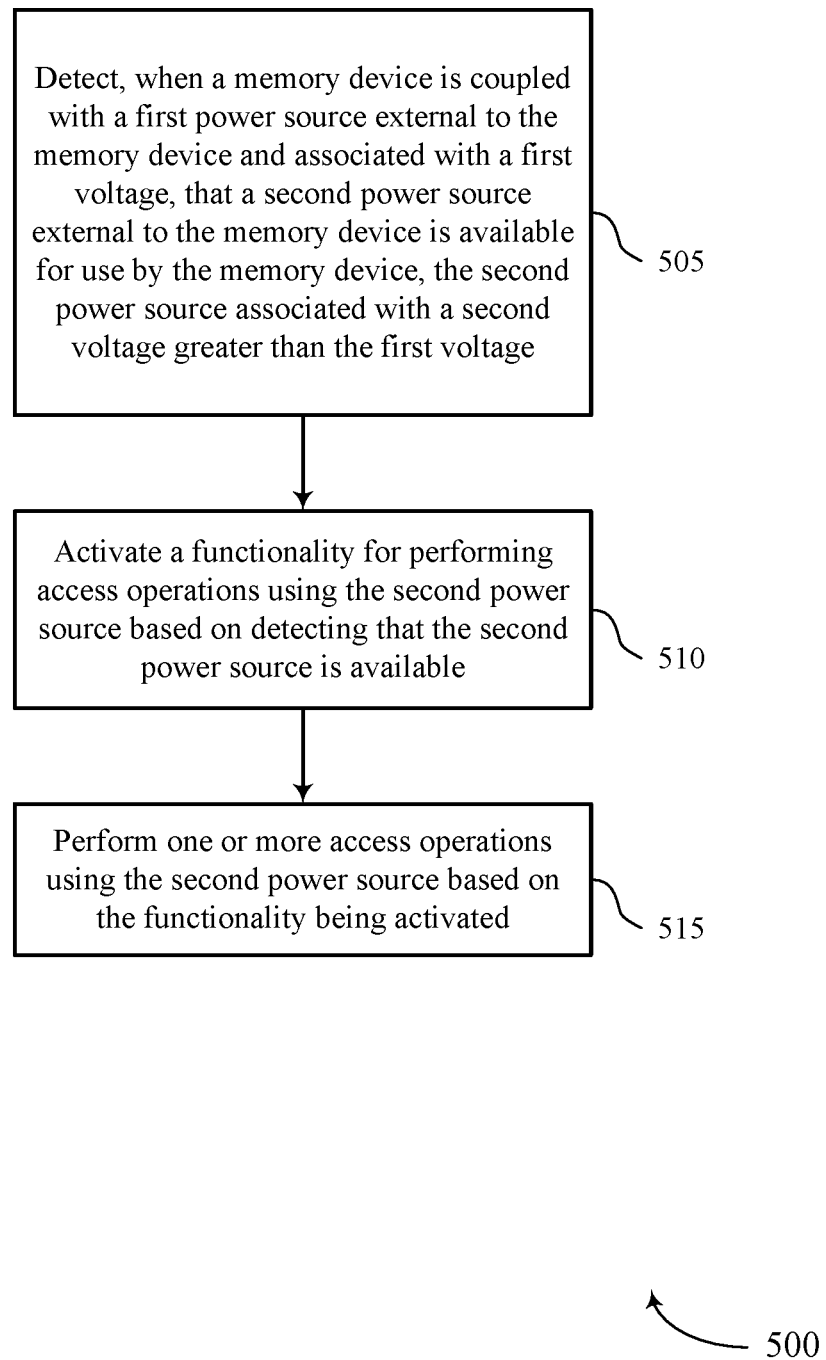
FIG. 5 shows a flowchart illustrating methods that support external power functionality techniques for memory devices in accordance with aspects of the present disclosure.

FIG. 5 shows a flowchart illustrating a method 500 that supports external power functionality techniques for memory devices in accordance with aspects of the present disclosure. The operations of method 500 may be implemented by a memory device, a memory system, or their components as described herein. For example, the operations of method 500 may be performed by a memory system as described with reference to FIGS. 1-4. In some examples, a memory system may execute a set of instructions to control the functional elements of the memory system to perform the functions described below. Additionally or alternatively, a memory system may perform aspects of the functions described below using special-purpose hardware.

At 505, the memory system may detect, when (e.g., while) a memory device is coupled with a first power source external to the memory device and associated with a first voltage, that a second power source external to the memory device is available for use by the memory device, the second power source associated with a second voltage greater than the first voltage. The operations of 505 may be performed according to the methods described herein. In some examples, aspects of the operations of 505 may be performed by a detection component as described with reference to FIG. 4.

At 510, the memory system may activate a functionality for performing access operations using the second power source based on detecting that the second power source is available. For example, the memory system may activate the functionality for performing access operations using the second power source in response to detecting that the second power source is available (e.g., a controller may send a command to a memory device of the memory system to activate the functionality, such as a SET FEATURE command indicating to activate the functionality, among other examples). The operations of 510 may be performed according to the methods described herein. In some examples, aspects of the operations of 510 may be performed by an activation component as described with reference to FIG. 4.

At 515, the memory system may perform one or more access operations using the second power source based on the functionality being activated. For example, the memory system may perform the one or more operations using the second power source in response to the functionality being activated (e.g., the memory system may perform write operations, read operations, etc., using a voltage of the second power source). The operations of 515 may be performed according to the methods described herein. In some examples, aspects of the operations of 515 may be performed by an access component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for detecting, when the memory device is coupled with a first power source external to the memory device and associated with a first voltage, that a second power source external to the memory device is available for use by the memory device, the second power source associated with a second voltage greater than the first voltage, activating a functionality for performing access operations using the second power source based at least in part on detecting that the second power source is available, and performing one or more access operations using the second power source based at least in part on the functionality being activated.

In some examples of the method 500 and the apparatus described herein, the detecting may occur during an initialization period for the memory device.

Some examples of the method 500 and the apparatus described herein may further include operations, features, means, or instructions for determining that the second power source satisfies a threshold voltage for a threshold duration during the initialization period, where activating the functionality is based at least in part on the second power source satisfying the threshold voltage for the threshold duration.

In some examples of the method 500 and the apparatus described herein, the operations, features, means, or instructions for performing one or more access operations using the second power source may include operations, features, means, or instructions for performing a read operation, a write operation, an erase operation, or any combination thereof using the second voltage from the second power source.

Some examples of the method 500 and the apparatus described herein may further include operations, features, means, or instructions for refraining from using a charge pump of the memory device for the one or more access operations based at least in part on the functionality for performing access operations using the second power source being activated.

Some examples of the method 500 and the apparatus described herein may further include operations, features, means, or instructions for detecting that the second power source external to the memory device is unavailable for use by the memory device, deactivating the functionality for performing access operations using the second power source being deactivated, and performing additional operations using a charge pump of the memory device based at least in part on the functionality for performing access operations using the second power source being deactivated.

In some examples of the method 500 and the apparatus described herein, the second power source may include a power supply within an automotive system.

In some examples of the method 500 and the apparatus described herein, the operations, features, means, or instructions for detecting that the second power source is available may include operations, features, means, or instructions for detecting that the second power source is coupled with an input of the memory device.

Some examples of the method 500 and the apparatus described herein may further include operations, features, means, or instructions for monitoring a node of a detection circuit, where the node is configured to be coupled with a reference voltage in response to the second power source being coupled with the input of the memory device, and determining that a voltage of the node satisfies a threshold voltage, where detecting that the second power source is available for use by the memory device is based at least in part on the voltage of the node satisfying the threshold voltage, where the reference voltage satisfies the threshold voltage.

In some examples of the method 500 and the apparatus described herein, a detection circuit may include one or more transistors configured to couple the node with the reference voltage in response to the second power source being coupled with the input of the memory device.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory array; and
a controller coupled with the memory array and configured to cause the apparatus to:
detect, when the apparatus is coupled with a first power source external to the apparatus and associated with a first voltage, that a second power source external to the apparatus is available for use by the apparatus, the second power source associated with a second voltage greater than the first voltage;
determine that the second power source satisfies a threshold voltage for a threshold duration;
activate a functionality for performing access operations using the second power source based at least in part on detecting that the second power source is available and determining that the second power source satisfies the threshold voltage for the threshold duration; and
perform one or more access operations using the second power source based at least in part on the functionality being activated.

2. The apparatus of claim 1, wherein the controller is further configured to cause the apparatus to perform the detecting during an initialization period for the apparatus.

3. The apparatus of claim 2, wherein the controller is configured to cause the apparatus to:
determine that the second power source satisfies the threshold voltage for the threshold duration during the initialization period.

4. The apparatus of claim 1, wherein, to perform the one or more access operations using the second power source, the controller is configured to cause the apparatus to:
perform a read operation, a write operation, an erase operation, or any combination thereof using the second voltage from the second power source.

5. The apparatus of claim 4, further comprising:
a charge pump, wherein the controller is further configured to cause the apparatus to:
refrain from using the charge pump of the apparatus for the one or more access operations based at least in part on the functionality for performing access operations using the second power source being activated.

6. The apparatus of claim 1, further comprising:
a charge pump, wherein the controller is further configured to cause the apparatus to:
detect that the second power source external to the apparatus is unavailable for use by the apparatus;
deactivate the functionality for performing access operations using the second power source; and
perform additional operations using the charge pump of the apparatus based at least in part on the functionality for performing access operations using the second power source being deactivated.

7. The apparatus of claim 1, wherein the second power source comprises a power supply within an automotive system.

8. The apparatus of claim 1, wherein, to detect that the second power source is available, the controller is further configured to cause the apparatus to:
detect that the second power source is coupled with an input of the apparatus.

9. The apparatus of claim 8, further comprising:
a detection circuit, wherein the controller is further configured to cause the apparatus to:
monitor a node of the detection circuit, wherein the node is configured to be coupled with a reference voltage in response to the second power source being coupled with the input of the apparatus; and
determine that a voltage of the node satisfies a second threshold voltage, wherein detecting that the second power source is available for use by the apparatus is based at least in part on the voltage of the node satisfying the second threshold voltage, and wherein the reference voltage satisfies the second threshold voltage.

10. The apparatus of claim 9, wherein the detection circuit comprises one or more transistors configured to couple the node with the reference voltage in response to the second power source being coupled with the input of the apparatus.

11. A non-transitory computer-readable medium storing code comprising instructions which, when executed by a processor of an electronic device, cause the electronic device to:
detect, when the electronic device is coupled with a first power source external to the electronic device and associated with a first voltage, that a second power source external to the electronic device is available for use by the electronic device, the second power source associated with a second voltage greater than the first voltage;
determine that the second power source satisfies a threshold voltage for a threshold duration;
activate a functionality for performing access operations using the second power source based at least in part on detecting that the second power source is available and determining that the second power source satisfies the threshold voltage for the threshold duration; and
perform one or more access operations using the second power source based at least in part on the functionality being activated.

12. The non-transitory computer-readable medium of claim 11, wherein the instructions, when executed by the processor of the electronic device, further cause the electronic device to perform the detecting during an initialization period for the electronic device.

13. The non-transitory computer-readable medium of claim 12, wherein the instructions, when executed by the processor of the electronic device, cause the electronic device to:
determine that the second power source satisfies the threshold voltage for the threshold duration during the initialization period.

14. The non-transitory computer-readable medium of claim 11, wherein, to cause the electronic device to perform the one or more access operations using the second power source, the instructions, when executed by the processor of the electronic device, cause the electronic device to:

perform a read operation, a write operation, an erase operation, or any combination thereof using the second voltage from the second power source.

15. The non-transitory computer-readable medium of claim 14, wherein the instructions, when executed by the processor of the electronic device, further cause the electronic device to:
refrain from using a charge pump of the electronic device for the one or more access operations based at least in part on the functionality for performing access operations using the second power source being activated.

16. The non-transitory computer-readable medium of claim 11, wherein the instructions, when executed by the processor of the electronic device, further cause the electronic device to:
detect that the second power source external to the electronic device is unavailable for use by the electronic device;
deactivate the functionality for performing access operations using the second power source; and
perform additional operations using a charge pump of the electronic device based at least in part on the functionality for performing access operations using the second power source being deactivated.

17. The non-transitory computer-readable medium of claim 11, wherein the second power source comprises a power supply within an automotive system.

18. A method performed by a memory device, comprising:
detecting, when the memory device is coupled with a first power source external to the memory device and associated with a first voltage, that a second power source external to the memory device is available for use by the memory device, the second power source associated with a second voltage greater than the first voltage;
determining that the second power source satisfies a threshold voltage for a threshold duration;
activating a functionality for performing access operations using the second power source based at least in part on detecting that the second power source is available and determining that the second power source satisfies the threshold voltage for the threshold duration; and
performing one or more access operations using the second power source based at least in part on the functionality being activated.

19. The method of claim 18, wherein the detecting occurs during an initialization period for the memory device.

20. The method of claim 19, wherein
determining that the second power source satisfies the threshold voltage for the threshold duration occurs during the initialization period.

* * * * *